(12) United States Patent
Jiang

(10) Patent No.: US 7,576,567 B2
(45) Date of Patent: Aug. 18, 2009

(54) LOW-VOLTAGE DIFFERENTIAL SIGNAL DRIVER FOR HIGH-SPEED DIGITAL TRANSMISSION

(75) Inventor: Jian Hong Jiang, Sunnyvale, CA (US)

(73) Assignee: Fujitsu Limited, Kanagawa (JP)

( * ) Notice: Subject to any disclaimer, the term of this patent is extended or adjusted under 35 U.S.C. 154(b) by 23 days.

(21) Appl. No.: 11/421,239

(22) Filed: May 31, 2006

(65) Prior Publication Data
US 2007/0279094 A1 Dec. 6, 2007

(51) Int. Cl.
*H03K 19/094* (2006.01)
*H03K 19/20* (2006.01)
*H03K 19/086* (2006.01)

(52) U.S. Cl. .................... 326/83; 326/112; 326/115; 326/121; 326/127

(58) Field of Classification Search .................. None
See application file for complete search history.

(56) References Cited

U.S. PATENT DOCUMENTS

| | | | |
|---|---|---|---|
| 6,111,431 A | 8/2000 | Estrada | 326/83 |
| 6,262,606 B1 | 7/2001 | Tamjidi | 327/108 |
| 6,313,662 B1 * | 11/2001 | Ide | 326/83 |
| 6,353,334 B1 * | 3/2002 | Schultz et al. | 326/82 |
| 6,992,508 B2 * | 1/2006 | Chow | 326/86 |
| 7,135,887 B1 | 11/2006 | Shumarayev et al. | 326/38 |
| 7,301,371 B2 | 11/2007 | Kim | 326/82 |
| 2001/0040466 A1 | 11/2001 | Ide | 326/83 |
| 2003/0197534 A1 | 10/2003 | Feng | 327/141 |
| 2003/0210074 A1 * | 11/2003 | Morgan et al. | 326/83 |
| 2004/0032282 A1 * | 2/2004 | Lee et al. | 326/39 |
| 2005/0179466 A1 | 8/2005 | Kasanyal et al. | 326/87 |
| 2005/0285629 A1 | 12/2005 | Hein et al. | 326/115 |
| 2006/0125533 A1 | 6/2006 | Kim et al. | 327/112 |

OTHER PUBLICATIONS

Ng et al., "Low Power Gbit/sec Low Voltage Differential Signaling I/O System," Electrical Engineering and Computer Science, University of California, Berkeley, 7 pages, http://www.ocf.berkeley.edu/~eng/classes/241Report.pdf, Jun. 29, 2006.
Patent Pending U.S. Appl. No. 11/421,256, entitled "Low-Voltage Differential Signal Driver for High-Speed Digital Transmission," by Jian Hong Jiang, 17 pages plus 3 drawing pages, filed May 31, 2006.
Patent Pending U.S. Appl. No. 11/421,522, entitled "Low-Voltage Differential Signal Driver for High-Speed Digital Transmission," by Jian Hong Jiang et al., 16 pages plus 2 drawing pages, filed Jun. 1, 2006.
USPTO Office Action for U.S. Appl. No. 11/421,256, inventor Jian Hong Jiang, Aug. 23, 2007.
USPTO Office Action for U.S. Appl. No. 11/421,256, inventor Jian Hong Jiang, Feb. 8, 2008.
USPTO Office Action for U.S. Appl. No. 11/421,256, inventor Jian Hong Jiang, Jul. 30, 2008.
USPTO Office Action for U.S. Appl. No. 11/421,256, inventor Jian Hong Jiang, Dec. 9, 2008.

* cited by examiner

*Primary Examiner*—Vibol Tan
*Assistant Examiner*—Matthew C Tabler
(74) *Attorney, Agent, or Firm*—Baker Botts L.L.P.

(57) ABSTRACT

A low-voltage differential signal driver for high-speed digital transmission includes a first converter operable to receive a signal in a first type and convert the signal into a second type, and a cascode current mirror coupled to the first converter. The cascode current mirror provides an impedance level that increases a differential output voltage.

17 Claims, 2 Drawing Sheets

US 7,576,567 B2

LOW-VOLTAGE DIFFERENTIAL SIGNAL DRIVER FOR HIGH-SPEED DIGITAL TRANSMISSION

TECHNICAL FIELD

This invention relates generally to signal communication, and more specifically, to a low-voltage differential signal (LVDS) driver for high-speed digital transmission.

BACKGROUND

Various Complementary Metal-Oxide Semiconductor (CMOS) driver architectures exist for high-speed digital transmission. The CMOS driver architectures encounter problems of low output voltage swing when the supply voltage approaches 1.2V. This problem arises because transistors in the signal path consume voltage headroom, which reduces the amplitude of the differential output voltage.

SUMMARY OF THE DISCLOSURE

In accordance with the present invention, disadvantages and problems associated with previous techniques for increasing differential output voltage using an LVDS driver may be reduced or eliminated.

According to one embodiment of the present invention, a low-voltage differential signal driver for high-speed digital transmission includes a first converter operable to receive a signal in a first type and convert the signal into a second type, and a cascode current mirror coupled to the first converter. The cascode current mirror provides an impedance level that increases a differential output voltage.

Certain embodiments of the invention may provide one or more technical advantages. A technical advantage of one embodiment includes providing higher impedance using a cascode mirrored configuration of transistors, which improves the differential output voltage of the LVDS driver. The improvement in differential output voltage increases the voltage headroom available for outputting signals by decreasing the voltage consumed by transistors. Therefore, there is more headroom for a signal before compression or distortion of the signal occurs.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
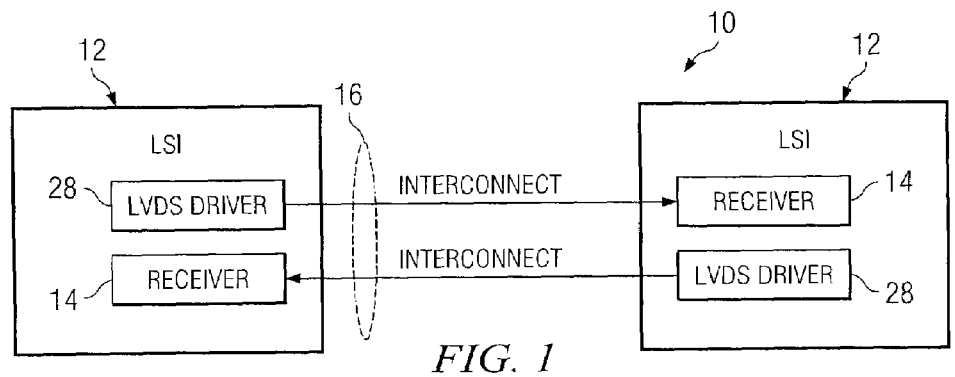
FIG. 1 illustrates one embodiment of a network element for digital transmission between large-scale integration (LSI) integrated circuits (ICs) having an LVDS driver for high-speed digital transmission.

FIG. 1 illustrates one embodiment of a network element 10 for digital transmission between large-scale integration (LSI) integrated circuits (ICs) 12 having an LVDS driver 28 for high-speed digital transmission. In the illustrated embodiment, network element 10 includes a plurality of LSI ICs 12. LSI ICs 12 include a receiver 14 and an LVDS driver 28 coupled by an interconnect 16. Receiver 14 receives packets from LVDS driver 28. Receiver 14 may include any suitable receiver. Reference to packets may include a packet, datagram, frame, or other unit of data. LVDS driver 28 drives differential signals for high-speed digital transmission from LSI IC 12. Interconnect 16 facilitates transmission of packets between LVDS driver 28 and receiver 14. Interconnect 16 may include any suitable element, such as a cable or a print circuit board trace.

It should be noted that although LVDS driver 28 is illustrated as being used in LSI IC 12 of network element 10, embodiments of the present invention may be used in any suitable network element in any suitable network or in any other appropriate application requiring digital signal transmission.

Figure 2:
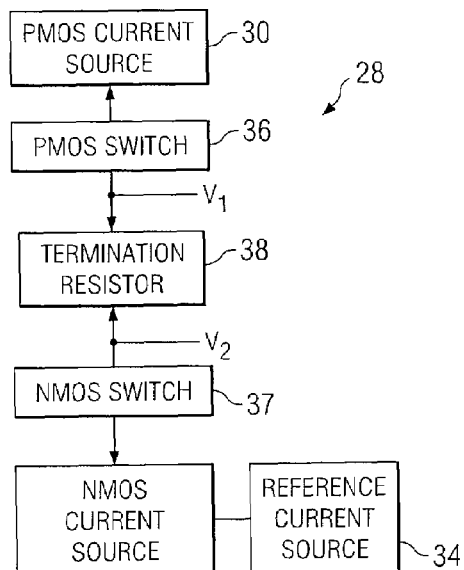
FIG. 2 illustrates a block diagram of the LVDS driver for improving differential output voltage.

FIG. 2 illustrates a block diagram of LVDS driver 28 for improving differential output voltage. Traditional driver architectures provide for the consumption of voltage headroom by components in the driver. The consumption of voltage headroom reduces the amplitude of the output voltage. For example, a traditional driver has a differential output voltage less than 400 mV. In particular embodiments, LVDS driver 28 improves the differential output voltage and increases the available voltage headroom.

In the illustrated embodiment, LVDS driver 28 includes a p-channel metal-oxide semiconductor field-effect transistor (PMOS) current source 30, an n-channel metal-oxide semiconductor field-effect transistor (NMOS) current source 32, a reference current source 34, a PMOS switch 36, an NMOS switch 37, and a termination resistor 38. PMOS current source 30 and NMOS current source 32 may be implemented as a single current source or as a digital-to-analog converter (DAC) structured current source. Current source 34 may be used for biasing. In an embodiment, current source 34 represents an NMOS current source. For example, a plurality of NMOS transistors form current source 34. In an embodiment, NMOS current source 32 and current source 34 couple to form a low-voltage cascode current mirror. The cascode current mirror is formed by coupling a plurality of the same transistors and mirroring the plurality of transistors. Additionally, the cascode current mirror operates at a low voltage to support high-speed digital transmissions.

The configuration of NMOS current source 32 and current source 34 as a low-voltage cascode mirror provides for higher impedance and therefore, improves differential output voltage, which is measured across termination resistor 38 as $V_1-V_2$. The improvement of differential output voltage between $V_1$ and $V_2$ provides additional voltage headroom for a signal transmitted by network element 22.

PMOS current source 30, NMOS current source 32, and current source 34 may include any suitable component that provides for improving differential output voltage. For example, PMOS current source 30, NMOS current source 32, and current source 34 include a combination of transistors that provide a path for current to flow when a voltage is applied. As another example, LVDS driver 28 includes any suitable transistors, such as PMOS transistors, NMOS transistors, or any suitable combination of the preceding.

Figure 3:
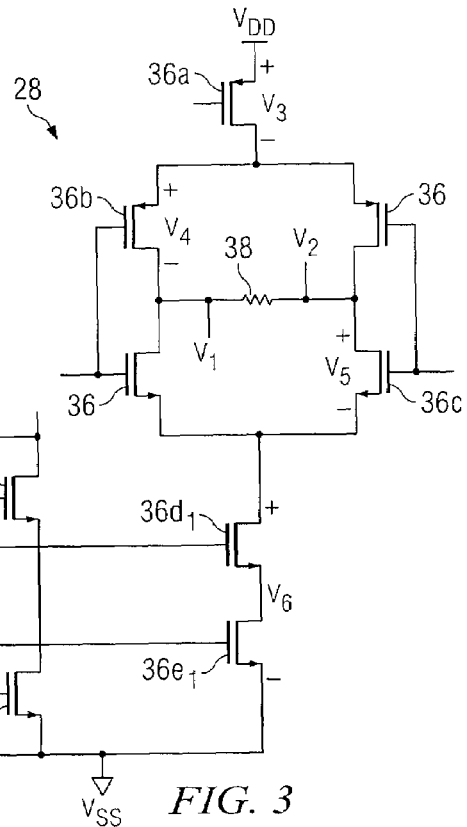
FIG. 3 illustrates an embodiment of a circuit-level diagram of the LVDS driver.

FIG. 3 illustrates an embodiment of a circuit-level diagram of LVDS driver 28. LVDS driver 28 includes a cascode current mirror that produces higher impedance than a basic current mirror. The higher impedance improves the differential output voltage. In the illustrated embodiment, LVDS driver 28 includes a plurality of transistors 36 and a resistor 38. Transistors 36 may be any suitable transistor, including, for example, metal-oxide semiconductor field effect transistors (MOSFETs). Resistor 38 may be any suitable resistance and may be any suitable value. For example, the component value of resistor 38 may be selected to produce a desired voltage drop between transistors 36.

Transistors 36 may be coupled to each other to operate as a current source with an applied voltage. For example, transistors 36 couple to form a low-voltage cascode current mirror. In the illustrated embodiment, transistors $36d_2$ and $36e_2$ mirror transistors $36d_1$ and $36e_1$ and form a low-voltage cascode current mirror. Using the low-voltage cascode current mirror, the mirrored combination of transistors 36 has higher impedance than a basic current mirror. Traditional drivers include a basic current mirror as a current source. The basic current mirror has low impedance, and therefore, traditional drivers have a lower differential output voltage. However, the higher impedance of the cascode current mirror provides for a smaller overall voltage drop over transistors $36d_1$ and $36e_1$, which increases the differential output voltage.

In operation, the current path starts from transistor 36a and flows to transistor 36b. In the illustrated embodiment, transistors 36a and 36b represent PMOS transistors. The current continues through resistor 38 and transistor 36c. The current then flows through transistors $36d_1$ and $36e_1$ to a Direct Current (DC) source ($V_{SS}$). In the illustrated embodiment, transistors 36c, $36d_1$, and $36e_1$ represent NMOS transistors.

The differential output voltage is measured across resistor 38 by determining the difference of $V_1$ and $V_2$ ($V_1-V_2$). Because LVDS driver 28 includes a cascode current mirror, the impedance is higher across transistors $36d_1$ and $36e_1$, which provides for a low voltage drop across transistors $36d_1$ and $36e_1$. The voltage drop provides for the increase of the differential output voltage across resistor 38.

Figure 4:
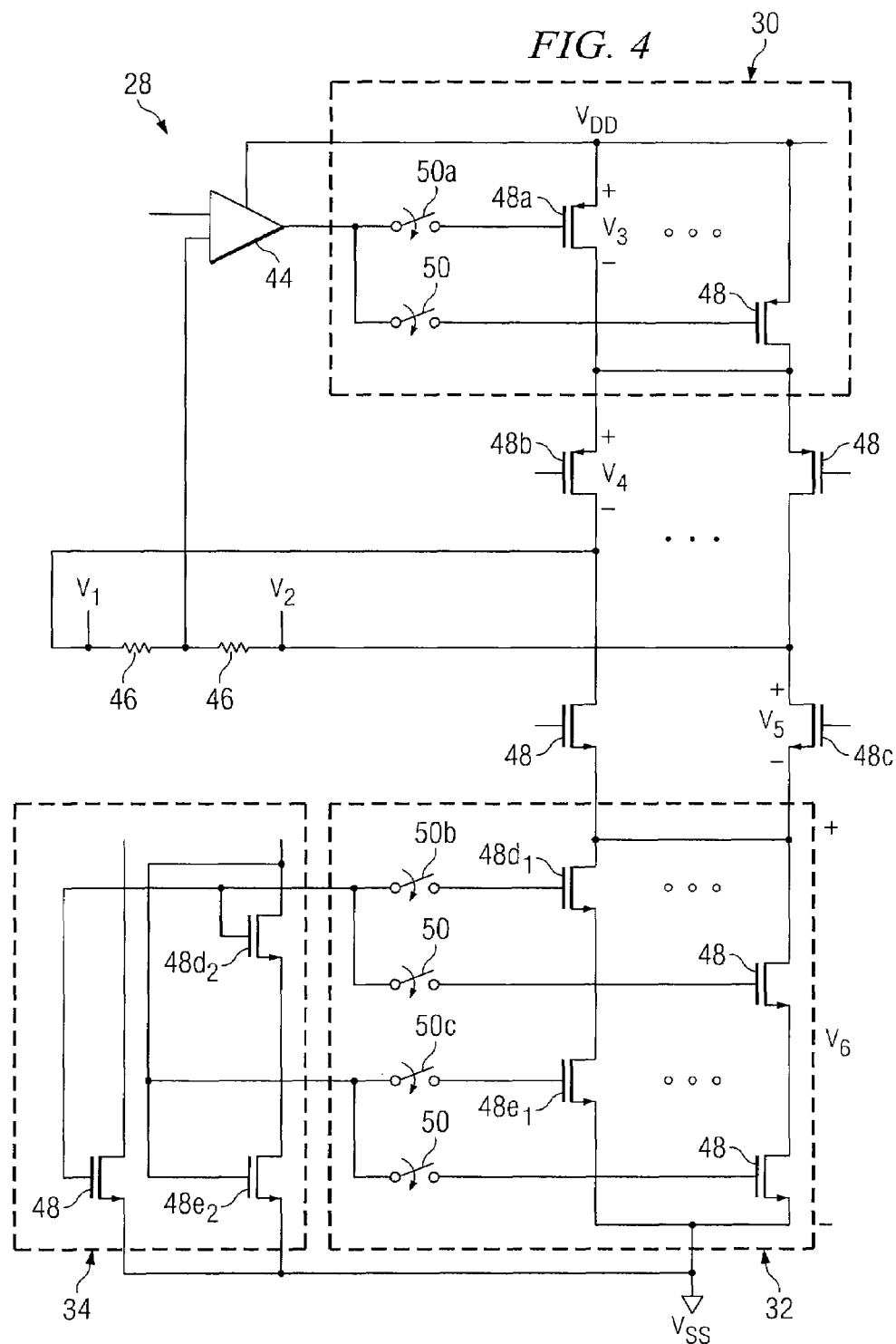
FIG. 4 illustrates another embodiment of a circuit-level diagram of the LVDS driver.

FIG. 4 illustrates another embodiment of a circuit-level diagram of LVDS driver 28. As described above, LVDS driver 28 has higher impedance than a basic current mirror, which increases the differential output voltage. In the illustrated embodiment, LVDS driver 28 includes PMOS current source 30 as a DAC structured current source (PDAC 30), NMOS current source 32 as a DAC structured current source (NDAC 32), reference current source 34, an amplifier 44, resistors 46, and transistors 48. PDAC 30 and NDAC 32 may convert digital signals to analog signals. PDAC 30 and NDAC 32 include transistors 48 and switches 50 coupled as illustrated in FIG. 4. Any suitable number of transistors 48 and switches 50 may be included in PDAC 30 and NDAC 32 to implement the process of converting analog signals to digital signals, and vice-versa.

LVDS driver 28 includes NDAC 32 and output common-mode feedback with PDAC 30 control loop. LVDS driver 28 achieves a differential output voltage swing greater than 0.7V when the supply voltage is 1.2V. The differential output voltage slightly decreases when the supply voltage decreases 10% to 1.08V.

In operation, the current path starts from transistor 48a and continues to transistor 48b. Engaging and disengaging switches 50 provide for controlling the current flow. For example, if current flows through transistor 48a, switch 50a is engaged. In the illustrated embodiment, transistors 48a and 48b are PMOS transistors. The current path continues to transistors 48c, $48d_1$, and $48e_1$. For example, if current flows through transistors $48d_1$ and $48e_1$, switches 50b and 50c, respectively, are engaged. In an embodiment, transistors 48c, $48d_1$, and $48e_1$ are NMOS transistors. Transistors 48a, $48d_1$, and $48e_1$ are in saturation mode, and transistors 48b and 48c act as input switches operating in a linear region. When all signals settle, the differential output voltage ($V_1-V_2$) equals the difference of a DC source ($V_{DD}$), the voltage drop across transistor 48a ($V_3$), the voltage drop across transistor 48b ($V_4$), the voltage drop across transistor 48c ($V_5$), and the voltage drop across transistors $48d_1$ and $48e_1$ ($V_6$) [$V_1-V_2=V_{DD}-V_3-V_4-V_5-V_6$]. For example, the differential output voltage is greater than 400 mV using the illustrated embodiment in FIG. 4.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A low-voltage differential signal driver for high-speed digital transmission, comprising:

a first current source operable to receive a signal in a first type and convert the signal into a second type, wherein the first current source comprises a set of at least two transistors and a switch associated with each transistor, the switch operable to control current flow into a gate of a transistor;

a common-mode feedback circuit coupled to the first current source and operable to control the first current source by controlling a common-mode voltage; and a cascode current mirror coupled to the first current source, the cascode current mirror provides an impedance level that increases a differential output voltage and increases a voltage headroom available to output the signal, wherein the cascode current mirror comprises:

a second current source operable to receive the signal in the second type and convert the signal into the first type, wherein the second current source comprises a first set of at least two transistors coupled in parallel with a second set of at least two transistors and a switch associated with each transistor, the switch operable to control current flow into a gate of a transistor; and a reference current source operable to bias a current, wherein the reference current source comprises:

a first transistor; and a second transistor coupled in series with a third transistor, wherein the first and second transistors have a common terminal that goes to the first set of at least two transistors and the third transistor has a terminal that goes to the second set of at least two transistors.

2. The driver of claim 1, wherein the signal in the first type is a digital signal, the signal in the second type is an analog signal, and the second current source is an analog-to-digital converter structured current source.

3. The driver of claim 1, wherein the signal in the first type is a digital signal, the signal in the second type is an analog signal, and the first current source is a digital-to-analog converter structured current source.

4. The driver of claim 1, wherein the cascode current mirror comprises a plurality of n-channel metal-oxide semiconductor field effect transistors.

5. The driver of claim 1, wherein the first current source comprises a plurality of p-channel metal-oxide semiconductor field effect transistors.

6. A low-voltage differential signal driver for high-speed digital transmission, comprising:
   a first current source operable to receive a signal in a first type and convert the signal into a second type, wherein the first current source comprises a set of at least two transistors and a switch associated with each transistor, the switch operable to control current flow into a gate of a transistor; and
   a common-mode feedback circuit coupled to the first current source and operable to control the first current source by controlling a common-mode voltage; and
   a cascode current mirror coupled to the first current source, the cascode current mirror provides an impedance level that increases a differential output voltage to greater than 400 mV and increases a voltage headroom available to output the signal, wherein the cascode current mirror comprises:
      a second current source operable to receive the signal in the second type and convert the signal into the first type, wherein the second current source comprises a first set of at least two transistors coupled in parallel with a second set of at least two transistors and a switch associated with each transistor, the switch operable to control current flow into a gate of a transistor; and
      a reference current source operable to bias a current, wherein the reference current source comprises:
         a first transistor; and
         a second transistor coupled in series with a third transistor, wherein the first and second transistors have a common terminal that goes to the first set of at least two transistors and the third transistor has a terminal that goes to the second set of at least two transistors.

7. The driver of claim 1, wherein the first converter and the cascode current mirror are operable to drive signals at an Ethernet switch.

8. A method for driving a low-voltage differential signal for high-speed digital transmission, comprising:
   receiving a signal in a first type at a first current source;
   converting the signal into a second type at the first current source, wherein the first current source comprises a set of at least two transistors and a switch associated with each transistor, the switch operable to control current flow into a gate of a transistor;
   controlling the first current source by controlling a common-mode voltage;
   providing a signal path through a low-voltage differential signal driver, wherein the signal continues through a cascode current mirror, the cascode current mirror providing an impedance level that increases a differential output voltage and increases a voltage headroom available to output the signal;
   receiving the signal in the second type at a second current source;
   converting the signal into the first type at the second current source, wherein the second current source comprises a first set of at least two transistors coupled in parallel with a second set of at least two transistors and a switch associated with each transistor, the switch operable to control current flow into a gate of a transistor; and
   biasing a current at a reference current source, wherein the reference current source comprises:
      a first transistor; and
      a second transistor coupled in series with a third transistor, wherein the first and second transistors have a common terminal that goes to the first set of at least two transistors and the third transistor has a terminal that goes to the second set of at least two transistors.

9. The method of claim 8, further comprising:
   receiving a signal in the second type; and
   converting the signal to the first type.

10. The method of claim 8, wherein the signal in the first type is a digital signal, and the signal in the second type is an analog signal.

11. The method of claim 8, wherein the differential output voltage is greater than 400 mV.

12. The method of claim 8, wherein providing a signal path comprises driving the signal at an Ethernet switch.

13. A system for driving a low-voltage differential signal for high-speed digital transmission, comprising:
   means for receiving a signal in a first type at a first current source;
   means for converting the signal into a second type at the first current source, wherein the first current source comprises a set of at least two transistors and a switch associated with each transistor, the switch operable to control current flow into a gate of a transistor;
   means for controlling the first current source by controlling a common-mode voltage;
   means for providing a signal path through a low-voltage differential signal driver, wherein the signal continues through a cascode current mirror, the cascode current mirror providing an impedance level that increases a differential output voltage and increases a voltage headroom available to output the signal;
   means for receiving the signal in the second type at a second current source;
   means for converting the signal into the first type at the second current source, wherein the second current source comprises a first set of at least two transistors coupled in parallel with a second set of at least two transistors and a switch associated with each transistor, the switch operable to control current flow into a gate of a transistor; and
   means for biasing a current at a reference current source, wherein the reference current source comprises:
      a first transistor; and
      a second transistor coupled in series with a third transistor, wherein the first and second transistors have a common terminal that goes to the first set of at least two transistors and the third transistor has a terminal that goes to the second set of at least two transistors.

14. The system of claim 13, further comprising:
   means for receiving a signal in the second type; and
   means for converting the signal to the first type.

15. The system of claim 13, wherein the signal in the first type is a digital signal, and the signal in the second type is an analog signal.

16. The system of claim 13, wherein the differential output voltage is greater than 400 mV.

17. The system of claim 13, further comprising means for driving the signal at an Ethernet switch.

* * * * *